United States Patent [19]

Lepere et al.

[11] 4,305,076

[45] Dec. 8, 1981

[54] DEVICE FOR THE AUTOMATIC TESTING OF DIGITAL FILTERS IN MOVING-TARGET INDICATORS

[75] Inventors: Guy Lepere; Didier Duval, both of Paris, France

[73] Assignee: Thomson-CSF, Paris, France

[21] Appl. No.: 110,254

[22] Filed: Jan. 7, 1980

[30] Foreign Application Priority Data

Jan. 9, 1979 [FR] France ............... 79 00419

[51] Int. Cl.³ .......................... G01S 7/40
[52] U.S. Cl. ..................... 343/17.7; 343/5 NQ; 367/13
[58] Field of Search ............ 343/17.7; 367/13

[56] References Cited

U.S. PATENT DOCUMENTS 4,003,054 1/1977 Goldstone ............. 343/17.7

Primary Examiner—T. H. Tubbesing
Attorney, Agent, or Firm—Karl F. Ross

[57] ABSTRACT

One or more digital filters in the output of an echo detector in a radar or sonar system are periodically checked for correct operation by the application of a test signal to their input and the comparison of a resulting output signal with a predetermined response code stored in a read-only memory. If the comparison fails, a visual indicator is actuated; if the defective filter is one of a plurality, it is blocked and the gain of the echo detector is adjusted to compensate for the reduction in signal level. With two filters in respective circuit branches carrying detected echo signals in relative quadrature, these filters are tested alternately; failure of either of them may cause its automatic replacement by a standby filter.

12 Claims, 4 Drawing Figures

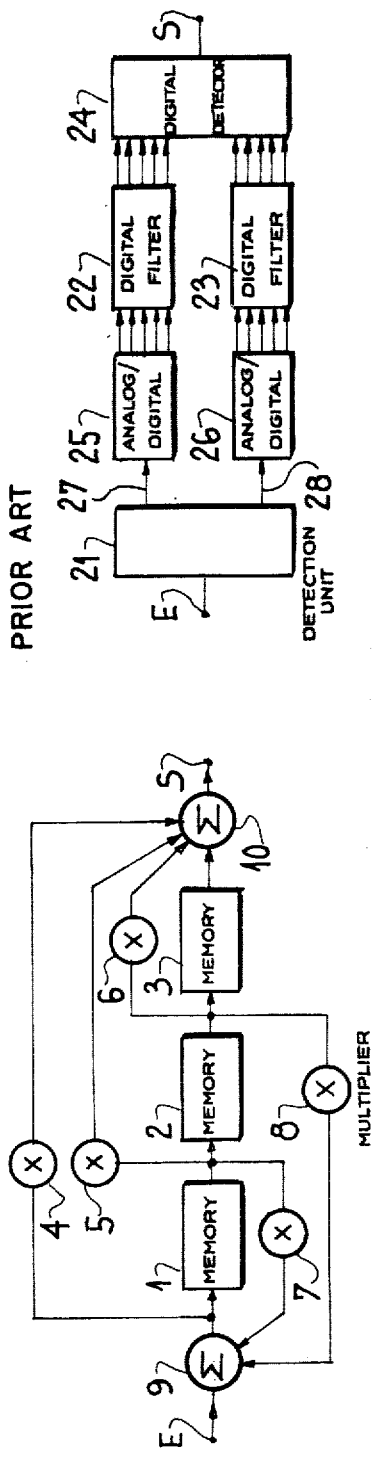

DEVICE FOR THE AUTOMATIC TESTING OF DIGITAL FILTERS IN MOVING-TARGET INDICATORS

FIELD OF THE INVENTION

Our present invention relates to a device for testing digital filters used in electromagnetic echo detectors such as radar and sonar equipment.

BACKGROUND OF THE INVENTION

In electromagnetic echo-detection systems, digital filters are used in the video circuits of components designed to eliminate signals from fixed-target echoes; these components are known as "moving-target indicators" abbreviated M.T.I.

The filters referred to operate by effecting a comparison of the signals obtained at time t with those obtained under the same conditions at time $t+\Delta t$. However, the structure of such filters rapidly becomes complex when multi-stage filtering is contemplated. These filters may break down increasingly with the increasing complexity of their structure and, under operating conditions, such failures are not easily detectable. Furthermore, as far as we are aware, such filters are generally not checked under operating conditions but are tested before being used and, if need be, may be subsequently retested outside the system which uses them.

OBJECT OF THE INVENTION

The object of our present invention is to provide means in a radar or sonar system for detecting failures of digital filters under operating conditions with the aid of periodic and automatic tests performed without loss of information.

SUMMARY OF THE INVENTION

An electromagnetic echo-detection (radar or sonar) system, whose receiver has output means connected to filter means for suppressing signals due to fixed-target echoes among digitized periodic samples of detected echo signals, is provided in accordance with our invention with a device for checking the operation of the filter means in the receiver output, this device comprising timing means synchronized with the receiver for periodically activating a generator of predetermined test signals to feed such a signal to the filter means. A comparator, connected to the filter means and to a memory storing a code which represents a predetermined response of the filter means to the test signals, emits a failure signal upon detecting a discrepancy between an output signal of the filter means and the stored code read out from the memory upon activation of the test-signal generator; the comparator is connected to malfunction-indicating means for actuating same by the emission of the failure signal.

In the specific embodiment described hereinafter, the receiver output comprises two circuit branches carrying digitized samples of echo signals in relative quadrature according to conventional practice. Two recursive filters constituting the aforementioned filter means are respectively inserted in the two branches and alternately receive test signals from the generator of these signals; a switchover circuit controlled by the timing means connects the filter outputs to the comparator in conformity with a switching of the generator from one filter to the other by the timing means.

Such recursive filters conventionally include storage means for temporarily retaining and feeding back a series of p samples (p being a predetermined number), that series being referred to hereinafter as a recurrent sequence. In such a case, pursuant to a more particular feature of our invention, the timing means may comprise a first counter steppable by successive samples and a second counter steppable by recurrent sequences as well as decoding means for emitting an activation signal to the test-signal generator in response to a predetermined reading of both counters.

BRIEF DESCRIPTION OF THE DRAWING

The above and other features of our present invention will now be described in detail with reference to the accompanying drawing in which:

FIG. 1 shows a three-stage digital filter to which our invention is applicable;

FIG. 2 is a block diagram of a moving-target indicator (M.T.I.) equipped with two digital filters;

FIG. 3 is a block diagram of the M.T.I. of FIG. 2 provided with a test device embodying our invention.

SPECIFIC DESCRIPTION

Figure 4:
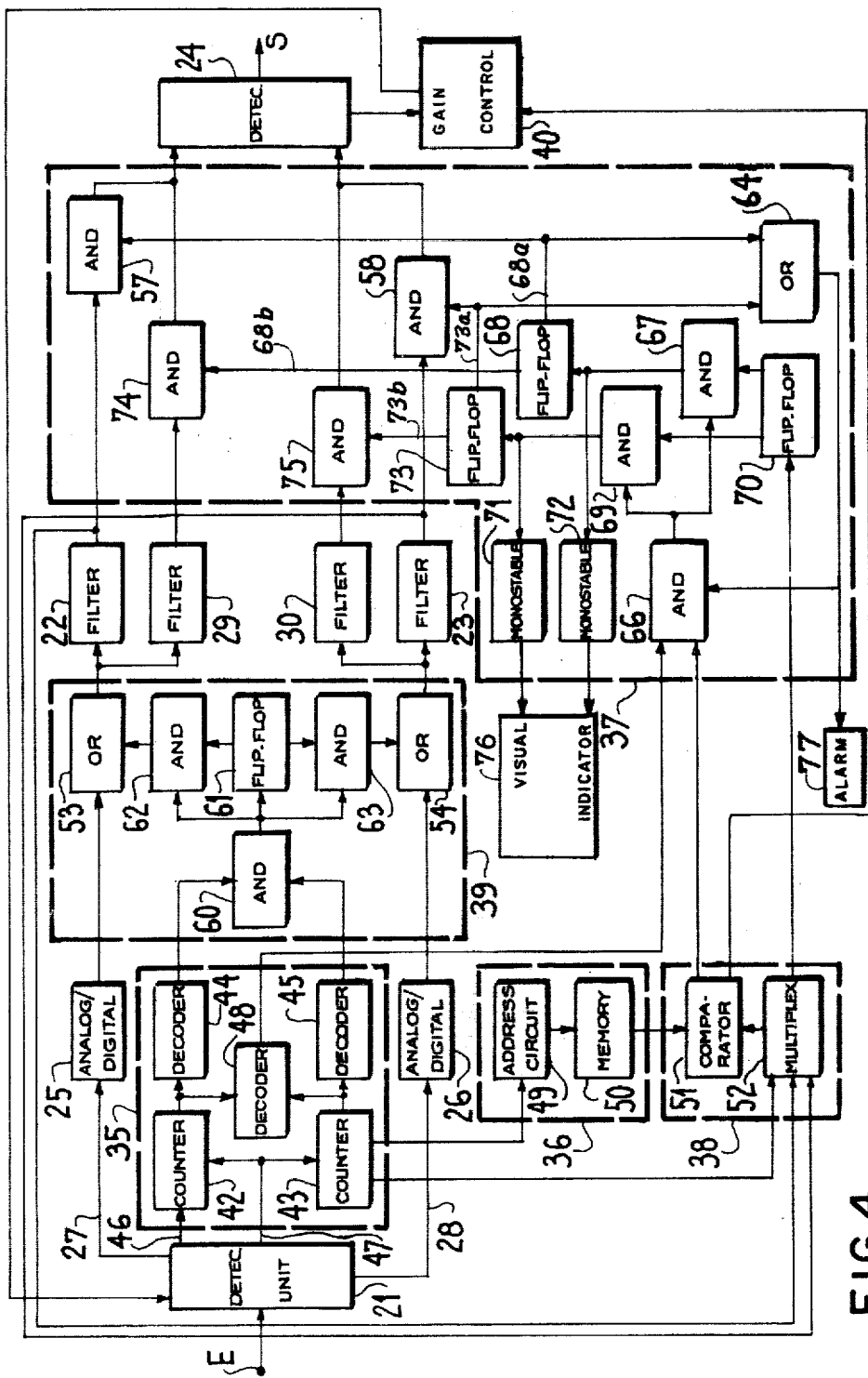
FIG. 4 shows details of the circuit arrangement of FIG. 3.

FIG. 1 shows a three-stage digital filter comprising three cascaded memories 1, 2, 3 of the shift-register type and five digital multipliers 4, 5, 6, 7, 8 whose multiplication factors are algebraic constants. The operation of this type of filter is known and will be only briefly recalled here. Reference may be had on this subject to numerous specialized works dealing with the topic such as, for example, that of J. Darricau entitled "Physique et theorie du Radar" published in the Sodipe editions 1973.

The signals arriving at a filter input E have been previously sampled and each sample has had its amplitude coded in the form of a binary word. A series of p words, forming a recurrent sequence and corresponding for example to the scanning range of a radar, are successively fed into memory 1 while passing through a summator 9 which algebraically adds these p words to as many words from the outputs of memories 1 and 2; the digital multipliers 7 and 8 multiply the binary words read out from memories 1 and 2 by fixed algebraic constants. This operation allows partial elimination of fixed echoes. The words issuing from summator 9 and from memories 1 and 2 are transmitted, on the one hand, to the immediately following memories and, on the other hand, by way of multipliers 4, 5 and 6 to an adder 10 also receiving the binary words read out from memory 3. Fixed echoes appear in the output S of adder 10 only as pulses of very low amplitude and may therefore be considered as being eliminated.

FIG. 2 shows a simplified diagram of a moving-target indicator equipped with two digital filters. In this diagram, a block 21 represents a radar or sonar detection unit or receiver up to and including its video circuits.

Unit 21 has an output circuit with two branches 27, 28 carrying periodically sampled video signals in relative quadrature, each sample being translated into binary form by an analog-digital converter 25, 26. Each of the converters is connected to a digital filter 22, 23 which may be of the recursive type described with reference to FIG. 1. These filters eliminate the fixed echoes and emit echo signals from moving targets in the form of multi-bit binary words. The signals are fed to a digital modulus detector 24. In this circuit, the signals from the two channels are squared and then added, and finally the square root of the sum of the squares is extracted to give the amplitude of the echo signal received by the radar or sonar detection circuit 21 from which the fixed echoes have been removed.

In the case of a partial or total failure of one of the filters it has heretofore been very difficult and often impossible to determine, especially during operation, the deterioration of the information received. To remedy a possible failure, operation of the detection system was periodically stopped to check the correct operation of the digital filters.

FIG. 3 shows a test device according to our invention designed to obviate the need for such interruption in the M.T.I. of FIG. 2.

Apart from the components shown in FIG. 2, i.e. a detection circuit 21, two analog-digital converters 25, 26, two digital filters 22, 23 and a modulus detector 24, the device of FIG. 3 comprises further a sample and sequence decoder and counter 35, a test-signal generator 39, an address and memory circuit 36 containing the theoretical responses of the filters used, a comparison circuit 38 located between memory 36 and the output of the tested filter (22 or 23), a failure-detecting and decision circuit 37, a control circuit 40 for readjusting the gain in case of a breakdown, and a digital-analog converter 41 connected to the output of circuit 40.

The operation of the device of FIG. 3 is as follows:

The analog output signal from detection circuit 21 is periodically sampled. At the last sample, for example, of a given recurrent sequence determined by the counting circuit 35, the test generator 39 injects a binary pulse into the digital input of one of the filters; the two filters are checked alternately. The response of the tested filter is compared by means of the comparison circuit 38 with the contents of the addressed memory 36 chosen by the counting circuit 35. The result of the comparison is then fed to decision circuit or malfunction detector 37 which, if a failure occurs, inhibits the faulty filter.

Circuit 40 readjusts the gain of receiver 21, on the basis of the mean value of a number of successive binary words representative of the level of the signal at the output of the modulus detector 24, if it receives a control pulse emitted by comparator 38.

A more detailed description of the aforedescribed embodiment of our invention will now be given with reference to FIG. 4 which supplements the components of FIG. 3 with two digital standby filters 29, 30 connected in parallel with filters 22, 23 to the output of test-signal generator 39. The counting and decoding circuit 35 comprises for example a sample counter 42, a sequence counter 43, a sample-number decoder 44, a sequence-number decoder 45 and a test-enabling decoder 48. The test-signal generator 39 comprises for example three AND circuits 60, 62, 63, two groups of OR circuits 53, 54 and a flip-flop 61. The address and memory circuit 36 comprises an address circuit 49 and a read-only memory 50. Comparison circuit 38 comprises a binary-word comparator 51 and a multiplexer or switchover circuit 52. The malfunction detector and inhibition circuit 37 comprises for example three AND circuits 66, 67, 69, a flip-flop 70 connected to multiplexer 52, two monostable circuits or monoflops 71, 72, two storage flip-flops 68, 73, an OR circuit 64 and two groups of AND circuits 57, 58 as well as two further AND gates 74, 75.

The operation of the device of FIG. 4 is as follows:

A clock signal 46 emitted by unit 21, of a frequency equal to the sampling rate, increments the sample counter 42 designed for example for 4096 samples. A timing signal 47, also emitted by unit 21, resets this counter at the beginning of each recurrent sequence and increments the counter 43 designed for example for 256 such sequences. At the last counting step, e.g. when the output bits from these counters are all at logic level 1, decoders 44 and 45, formed for example by AND circuits, deliver a binary pulse. When the two decoders emit simultaneous pulses, AND circuit 60 generates an activation signal in the form of a binary pulse which, through AND circuits 62, 63 and flip-flop 61, causes a binary pulse to appear at the inputs of one of the groups of OR circuits 53, 54. This group of circuits then causes all the input bits of the filter to be set at logic level 1. Flip-flop 61 acts here as a selection switch for the filter 22 or 23 to be tested. At each recurrence of the number of the test sequence, which is for example the last counting step of circuit 43, circuit 49 receives a binary word corresponding to the address of the theoretical response of the chosen filter stored in read-only memory 50.

Comparator 51, which may comprise for example a set of "Exclusive OR" circuits, receives on the one hand the stored code word read out from memory 50 and, on the other hand, the response of the tested filter to the binary pulse which has been applied thereto by OR gates 53 or 54; this filter is selected by multiplexer 52 switched concurrently with the bistable circuit 61 of the test-signal generator 39 by means of sequence counter 43. Comparator 51 delivers a failure signal in the form of a binary pulse if the binary word from the memory and the one from filter 22 or 23, selected by multiplexer 52, are not identical. This pulse is applied simultaneously with a test-enabling signal, generated by the decoding circuit 48, to AND circuit 66; the latter circuit thereupon conducts and also causes conduction of one of the AND gates 67, 69 chosen alternately by flip-flop 70 under the contol of multiplexer 52, which results in a switchover of the corresponding flip-flop 68 or 73 in the output of the respective AND gate. The switched flip-flop delivers a zero signal on a lead 68a or 73a to one of the AND circuits 57, 58 which thereupon permanently blocks the output of the tested filter 22 or 23. Concurrently, the "failure" pulse causes the switching of one of the monoflops 71, 72 whose outputs are connected to a visual indicator 76 such as a set of lamps. If decision circuit 37 delivers a failure-indicating inhibition pulse to each filter, i.e. if leads 68a and 73a are both at logic level "O", OR gate 64 delivers a zero pulse to the coincidence gate 66 for emission of further inhibiting signals thereby; the cutoff of gate 64 also triggers an alarm-signal generator 77.

As will be apparent to persons skilled in the art, test-signal generator 39 and failure detector 37 may include components different from those illustrated.

Our invention enables any number of filters to be checked, provided the capacity of the various circuits is adapted to the number of filters. The particular case of a single filter makes the decision circuit 37 unnecessary because there would then be no need to inhibit the faulty filter.

The digital filters to be tested may be mounted in series or in parallel, the binary test pulse being applied to the input of the tested filter and the response of the filter being extracted from the output thereof. Furthermore, the invention can be applied to nonrecursive digital filters. In this case, the sequence counter 43 is omitted and a test period is simply defined by a fixed number of samples as determined by counter 42.

In FIG. 4 we have also shown that the inhibition of a faulty filter 22 or 23 may be combined with its replacement by a spare filter. Thus, output leads 68b, 73b of flip-flops 68, 73 (whose logic levels are high when those of companion leads 68a and 73a are low) are respectively connected to two AND circuits 74, 75 in the outputs of standby filters 29, 30 whereby either of them is automatically substituted for the faulty filters associated therewith.

Furthermore, binary signals other than a set of short pulses may be injected into the inputs of the filters to be tested.

We claim:

1. In an electromagnetic echo-detection system comprising a receiver with output means carrying digitized periodic samples of detected echo signals and filter means connected to said output means for suppressing signals due to fixed-target echoes, the combination therewith of a device for checking the operation of said filter means, said device comprising:

a generator of predetermined test signals;

timing means synchronized with said receiver for periodically activating said generator to feed a test signal to said filter means;

memory means for storing a code representing a predetermined response of said filter means to said test signals;

comparison means connected to said filter means and to said memory means for emitting a failure signal upon detecting a discrepancy between an output signal of said filter means and the stored code read out from said memory means upon activation of said generator; and malfunction-indicating means connected to said comparison means for actuation by said failure signal.

2. The combination defined in claim 1 wherein said output means includes two circuit branches carrying digitized samples of echo signals in relative quadrature, said filter means comprising two recursive filters respectively inserted in said branches, said generator being switchable by said timing means for feeding test signals alternately to said recursive filters, the latter having output connections extending to said comparison means via a switchover circuit controlled by said timing means.

3. The combination defined in claim 2 wherein said timing means comprises a first counter steppable by successive samples, a second counter steppable by recurrent sequences each consisting of a predetermined number p of consecutive samples, and decoding means for emitting an activation signal to said generator in response to a predetermined reading of both said counters, said switchover circuit being controlled by said second counter, each of said recursive filters including storage means for temporarily retaining and feeding back a series of p samples.

4. The combination defined in claim 3 wherein said generator comprises bistable means synchronized with said switchover circuit for alternate switching by said activation signal between a first and a second state, first logic-gate means in one of said branches controlled by said bistable means in said first state thereof for feeding a test signal to one of said recursive filters, and second logic-gate means in the other of said branches controlled by said bistable means in said second state for feeding a test signal to the other of said recursive filters.

5. The combination defined in claim 4 wherein said malfunction-indicating means includes a coincidence gate with inputs connected to said timing means and to said comparison means for emitting an inhibiting signal upon concurrently receiving said failure signal and an enabling signal accompanying said activation signal, first logical circuitry controlled by said switchover circuit for transmitting said inhibiting signal from said coincidence gate to said one of said branches in said first state of said bistable means to cut off said one of said recursive filters, and second logical circuitry controlled by said switchover circuit for transmitting said inhibiting signal from said coincidence gate to said other of said branches in said second state of said bistable means to cut off said other of said recursive filters.

6. The combination defined in claim 5, further comprising a logic gate connected to said first and second logical circuitries for blocking said coincidence gate upon deactivation of both said recursive filters.

7. The combination defined in claim 6, further comprising alarm means connected to said logic gate for operation thereby upon deactivation of both said recursive filters.

8. The combination defined in claims 5, 6 or 7, further comprising a first standby filter operatively insertable by said first logical circuitry in said one of said branches upon cutoff of said one of said recursive filters and a second standby filter operatively insertable by said second logical circuitry in said other of said branches upon cutoff of said other of said recursive filters.

9. The combination defined in claims 5, 6 or 7 wherein said malfunction-indicating means further includes a visual indicator with inputs connected to said first and second logical circuitries for actuation by said inhibiting signal.

10. The combination defined in claim 9 wherein the connections between said first and second logical circuitries and the inputs of said visual indicator include respective monoflops triggerable by said inhibiting signal.

11. The combination defined in claims 3, 4, 5, 6 or 7 wherein said memory means comprises a read-only memory addressable under the control of said second counter for alternately reading out respective response codes of said recursive filters.

12. The combination defined in claims 5, 6 or 7, further comprising gain-control means connected to said comparison means for readjusting the gain of said receiver upon a cutoff of one of said recursive filters to compensate for the resulting decrease in signal level.

* * * * *